(12) United States Patent
Kai et al.

(10) Patent No.: US 8,252,612 B2
(45) Date of Patent: Aug. 28, 2012

(54) ORGANIC EL DISPLAY DEVICE AND MANUFACTURING METHOD THEREOF

(75) Inventors: Kazuhiko Kai, Mobara (JP); Masahiro Tanaka, Chiba (JP); Yoshinori Ishii, Chiba (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 195 days.

(21) Appl. No.: 12/630,860

(22) Filed: Dec. 4, 2009

(65) Prior Publication Data

US 2010/0140644 A1 Jun. 10, 2010

(30) Foreign Application Priority Data

Dec. 4, 2008 (JP) .................................. 2008-310129

(51) Int. Cl.
*H01L 33/00* (2010.01)
(52) U.S. Cl. ...................... 438/30; 438/14; 257/E33.059
(58) Field of Classification Search .................... 438/27, 438/14, 30; 257/98, E33.059, E21.502; 445/23
See application file for complete search history.

(56) References Cited

U.S. PATENT DOCUMENTS 7,163,833 B2 * 1/2007 Jinno .............................. 438/30

FOREIGN PATENT DOCUMENTS

| EP | 1 021 070 A1 | 7/2000 |
| JP | 2000-208252 | 7/2000 |

* cited by examiner

*Primary Examiner* — Roy Potter
(74) *Attorney, Agent, or Firm* — Antonelli, Terry, Stout & Kraus, LLP.

(57) ABSTRACT

An object of the invention is to provide an organic EL display device manufacturing method that allows the reliability of the organic EL display device having undergone a defect repair process to be improved. A method for manufacturing an organic EL display device, the method including an organic EL element substrate formation step of forming at least one organic EL element on an organic EL element substrate, the organic EL element including an organic EL film, an anode electrode and a reflection electrode that form a first conductive film provided below the organic EL film, and a cathode electrode that forms a second conductive film provided above the organic EL film, a resin sealing step of providing a thermoplastic sealing resin to cover the upper side of the organic EL element, a defect detection step of detecting a defect in the organic EL element, and a defect elimination step of eliminating the defect detected in the defect detection step by irradiating the defect with a laser beam.

9 Claims, 6 Drawing Sheets

ORGANIC EL DISPLAY DEVICE AND MANUFACTURING METHOD THEREOF

CROSS-REFERENCE TO RELATED APPLICATIONS

The present application claims priority from Japanese Application JP 2008-310129 filed on Dec. 4, 2008, the content of which is hereby incorporated by reference into this application.

BACKGROUND OF THE INVENTION

1. Field of the Invention

The present invention relates a method for manufacturing an organic EL display device using organic EL elements (OLED: Organic Light-Emitting Diode) for pixel display control, and particularly to correction of defects that occur in the organic EL elements.

2. Description of Related Art

A contaminant X present in an organic EL film in an organic EL display device using hollow sealing technique may result in a short circuit between an anode electrode AD and a cathode electrode CD that sandwich the organic EL film in some cases. A pixel where a short circuit occurs as described above emits no light because no current flows through the organic EL film, and the entire pixel becomes a black dot (black-dot defect).

The black-dot defect is typically removed by carrying out a repair process in which the contaminant is irradiated with a laser beam so that the short circuit between the two electrodes is eliminated, as described in JP-A-2000-208252. The laser repair removes not only the contaminant but also the surrounding organic EL film and cathode electrode CD, as shown in FIG. 7. The short circuit between the anode electrode AD and the cathode electrode CD is thus eliminated, which allows current to flow through the organic EL film and light to be emitted.

SUMMARY OF THE INVENTION

When the cathode electrode CD is repaired, however, the edge of the portion of the cathode electrode CD that is left after the laser irradiation forms a burr in a sealed hollow area PU filled with nitrogen or any other suitable gas, as shown in FIG. 7. The shape of the burr likely leads to electric field concentration. When electric field concentration occurs at the burr of the cathode electrode CD, the portion around the burr may be destroyed and a defect is produced again in some cases.

Further, when the repaired portion is, for example, pressed from the side where a sealing substrate is present, the burr of the cathode electrode CD may be broken and the broken piece may allow conduction between the two electrodes again, resulting in a black-dot defect.

The invention has been made in view of the problems described above. An object of the invention is to provide an organic EL display device and an organic EL display device manufacturing method that allows the reliability of the organic EL display device having undergone a defect repair process to be improved.

(1) To solve the problems described above, a method for manufacturing an organic EL display device according to the invention includes an organic EL element substrate formation step of forming at least one organic EL element on an organic EL element substrate, the organic EL element including an organic EL film, a first conductive film provided below the organic EL film, and a second conductive film provided above the organic EL film, a resin sealing step of providing a thermoplastic sealing resin to cover the upper side of the organic EL element, a defect detection step of detecting a defect in the organic EL element, and a defect elimination step of eliminating the defect detected in the defect detection step by irradiating the defect with a laser beam.

(2) In the method for manufacturing an organic EL display device described in (1), the defect elimination step is carried out in such a way that an opening is formed in the second conductive film when the defect is irradiated with the laser beam, the edge of the opening being raised toward not only the side where the sealing resin is present but also the side where the organic EL film is present and hence thicker than the second conductive film.

(3) In the method for manufacturing an organic EL display device described in (2), the defect elimination step is carried out in such a way that at least part of the edge on the side where the organic EL film is present is covered with the sealing resin.

(4) In the method for manufacturing an organic EL display device described in (3), the defect elimination step is carried out in such a way that the organic EL film in the vicinity of the opening is removed when the defect is irradiated with the laser beam, and the sealing resin is heated and softened to fill the area from which the organic EL film is removed, whereby the sealing resin is interposed between the first conductive film and the second conductive film.

(5) In the method for manufacturing an organic EL display device described in (1), the sealing resin has thermoplasticity in which the sealing resin solidifies at room temperature, whereas softening at a temperature within a predetermined range outside room temperature.

(6) In the method for manufacturing an organic EL display device described in (5), the sealing resin softens at a temperature within a range from 50 to 250 degrees inclusive.

(7) In the method for manufacturing an organic EL display device described in (1), the sealing resin has a desiccating agent capability.

(8) The method for manufacturing an organic EL display device described in (1) further includes a sealing substrate attachment step of attaching a sealing substrate that covers the upper side of the organic EL element and the sealing resin to the organic EL element substrate. In the organic EL element substrate formation step, a plurality of organic EL elements that emit light in different colors are formed on the organic EL element substrate, and in the defect elimination step, the laser beam is applied downward to the sealing substrate.

(9) The method for manufacturing an organic EL display device described in (1) further includes a sealing substrate attachment step of providing a thermoplastic sealing resin on a sealing substrate and attaching the sealing substrate to the organic EL element substrate. In the organic EL element substrate formation step, a plurality of organic EL elements that emit light in different colors are formed on the organic EL element substrate, and in the defect elimination step, the laser beam is applied downward to the sealing substrate.

(10) In the method for manufacturing an organic EL display device described in (1), the first conductive film is a conductive film that reflects the light emitted from the organic EL film, and the second conductive film is a transparent conductive film that transmits the light emitted from the organic EL film.

(11) To solve the problems described above, an organic EL display device according to the invention includes an organic EL element substrate on which at least one organic EL element is formed, the organic EL element including an organic EL film, a first conductive film provided below the organic EL film, and a second conductive film stacked on the organic EL film, and a thermoplastic sealing resin that covers the upper side of the organic EL element. An opening is formed in the second conductive film in any of the organic EL elements, and the edge of the opening is raised toward not only the side where the sealing resin is present but also the side where the organic EL film is present and hence thicker than the second conductive film.

(12) In the organic EL display device described in (11), at least part of the edge on the side where the organic EL film is present is covered with the sealing resin.

(13) In the organic EL display device described in (12), the portion of the organic EL film that is in the vicinity of the opening is removed, and the portion of the organic EL film is filled with the sealing resin in such a way that the sealing resin is interposed between the first conductive film and the second conductive film.

(14) In the organic EL display device described in (11), the sealing resin has a desiccating agent capability.

(15) In the organic EL display device described in (11), the sealing resin has thermoplasticity in which the sealing resin solidifies at room temperature, whereas softening at a temperature within a predetermined range outside room temperature.

(16) In the organic EL display device described in (15), the sealing resin softens at a temperature within a range from 50 to 250 degrees inclusive.

(17) The organic EL display device described in (11) further includes a sealing substrate that covers the upper side of the organic EL element and the sealing resin, and a plurality of organic EL elements that emit light in different colors are formed on the organic EL element substrate.

(18) The organic EL display device described in (11) further includes a sealing substrate to which the sealing resin that covers the upper side of the organic EL element is attached, and a plurality of organic EL elements that emit light in different colors are formed on the organic EL element substrate.

(19) In the organic EL display device described in (17), the first conductive film is a conductive film that reflects the light emitted from the organic EL film upward, and the second conductive film is a transparent conductive film that transmits the light emitted from the organic EL film.

According to the method for manufacturing an organic EL display device described in (1), the reliability of an organic EL display device having undergone a defect repair process can be improved.

DESCRIPTION OF THE PREFERRED EMBODIMENTS

A method for manufacturing an organic EL display device according to an embodiment of the invention will be described below with reference to the drawings.

The organic EL display device in the present embodiment includes a glass substrate on which organic EL elements are formed in a matrix in correspondence with pixels and a sealing substrate to be bonded to the organic EL element substrate to seal the organic EL elements. The organic EL display device is thus formed as a top-emission device in which an image display area is formed on the side where the sealing substrate is present.

Figure 1:
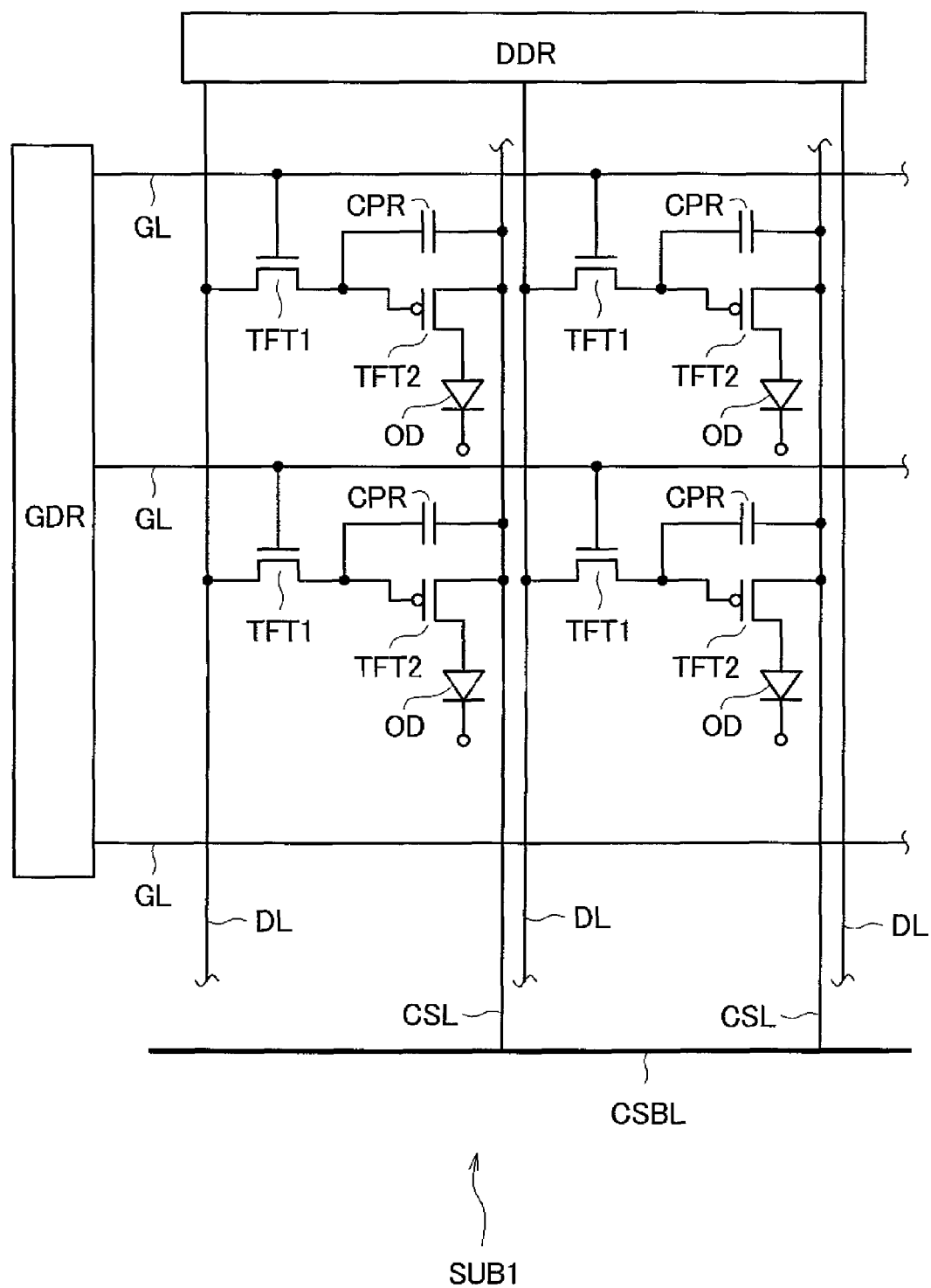
FIG. 1 is a circuit diagram showing an exemplary circuit provided on a glass substrate in an organic EL display device.

FIG. 1 is a circuit diagram showing an exemplary circuit provided on a glass substrate SUB1 in the organic EL display device described above. On the glass substrate SUB1 shown in FIG. 1, a large number of scan signal lines GL equally spaced apart from each other extend in the horizontal direction, and a large number of image signal lines DL equally spaced apart from each other extend in the vertical direction. The scan signal lines GL and the image signal lines DL partition the glass substrate SUB1 to create pixels arranged in a grid pattern. In each of the thus separately created pixel areas are formed switching thin-film transistor TFT1 having an MIS (Metal-Insulator-Semiconductor) structure, a thin-film transistor TFT2 used to drive a light emitter, a storage capacitor CPR, and an organic EL element OD. Power lines CSL that supply electric power to the organic EL elements OD extend in the vertical direction in FIG. 1 in parallel to the image signal lines DL. The scan signal lines GL and the image signal lines DL, which create the individual pixel areas, are connected to a scan line drive circuit GDR and an image line drive circuit DDR, respectively, and driven in accordance therewith, and the power lines CSL are connected to a power bus line CSBL and provide current.

In the circuit diagram of FIG. 1, when a gate voltage is applied to any of the scan signal lines GL so that the corresponding pixel row is selected, and an image signal is supplied through any of the image signal lines DL, the corresponding switching thin-film transistor TFT1 is turned on, and electric charge is stored in the storage capacitor CPR. When electric change is stored in the storage capacitor CPR, the driving thin-film transistor TFT2, which provides current to the organic EL element OD, is turned on and current flows through the power line CSL to the organic EL element OD, which then emits light.

Figure 2:
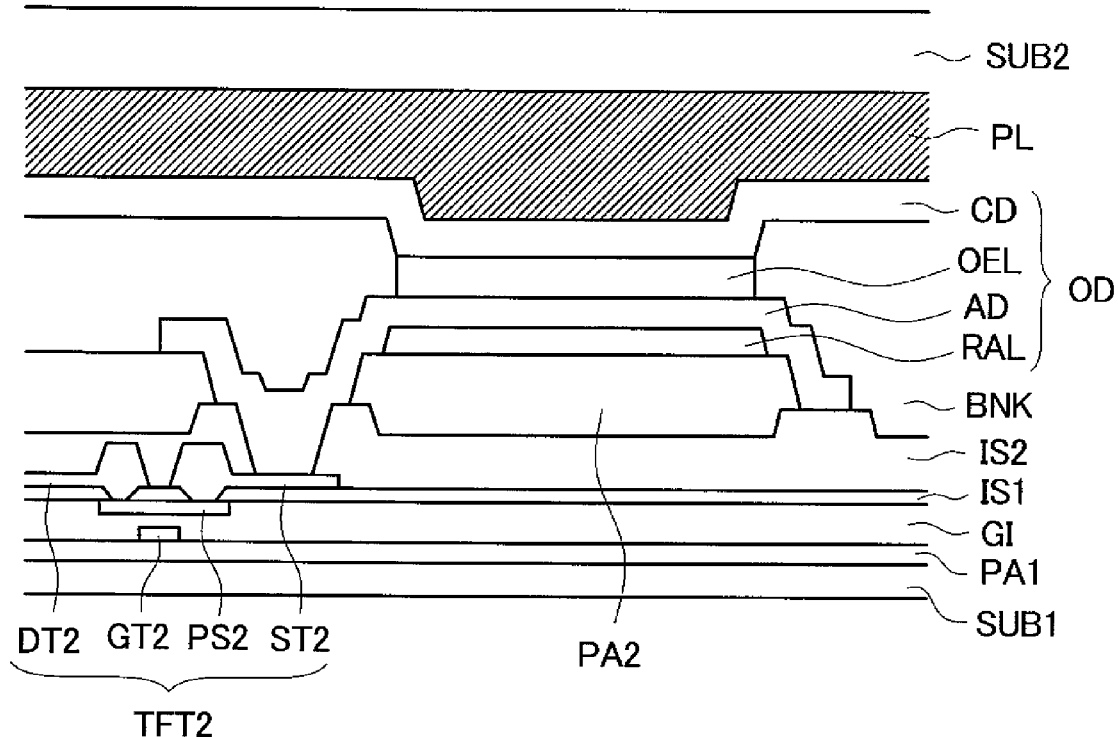
FIG. 2 is a cross-sectional view schematically showing a pixel area in the organic EL display device.

FIG. 2 is a cross-sectional view schematically showing any one of the pixel areas described above. As shown in FIG. 2, a protective layer PA1 is formed on the glass substrate SUB1, and a gate electrode GT2, a gate insulating layer GI, a semiconductor film PS2 made of polycrystalline silicon, an insulating layer IS1, a drain electrode DT2, and a source electrode ST2 form the thin-film transistor TFT2. In the thin-film transistor TFT2, the current flowing through the drain electrode DT2 and the source electrode ST2 is controlled by using the thin-film transistor TFT1 (not shown in FIG. 2) along with the storage capacitor CPR (not shown in FIG. 2) to control a voltage applied to the gate electrode GT2. The drain electrode DT2 is connected to the corresponding power line CSL and supplies current to an anode electrode AD connected to the source electrode ST2 in accordance with the voltage applied to the gate electrode GT2. The thin-film transistor TFT2 is covered with an insulating layer IS2 formed for planarization and a protective layer PA2, and the source electrode ST2 is connected to the anode electrode AD via a contact hole provided in the insulating layer IS2 and the protective layer PA2.

The organic EL element OD is disposed on the protective layer PA2 and surrounded by a bank layer BNK that separates the pixel areas in a grid pattern. A reflection electrode RAL is provided between the anode electrode AD and the protective layer PA2, and the organic EL element OD is formed of the anode electrode AD and the reflection electrode RAL provided on the lower side, the cathode electrode CD provided on the upper side, and an organic light-emitting layer OEL (organic EL film) sandwiched therebetween.

In the present embodiment, the anode electrode AD is made of indium tin oxide (ITO). The cathode electrode CD is made of indium zinc oxide (IZO) and formed as a transparent conductive film. The reflection electrode RAL is made of aluminum. The cathode electrode CD functions as a cathode and is formed as an electrode common to all the pixel areas and extends substantially all over the image display area. On the other hand, the anode electrode AD functions as an anode and is formed along with the reflection electrode RAL for each of the pixel areas. The organic light-emitting layer OEL is formed by stacking a hole transport layer, a light-emitting layer, and an electron transport layer in this order from below to above. The light-emitting layer in the organic light-emitting layer OEL is made of an organic compound selected from those different from each other in accordance with the emission color. Each of the light-emitting layers thus emits red, green, or blue light.

The light-emitting layer in the organic light-emitting layer OEL emits light when holes injected from the anode electrode AD and electrons injected from the cathode electrode CD recombine. Since the organic EL display device in the present embodiment is a top-emission device, the anode electrode AD and the reflection electrode RAL are located below the organic light-emitting layer OEL. The light emitted from the light-emitting layer passes through a sealing resin PL and a sealing substrate SUB2 made of light-transmissive materials and goes out of the device.

In particular, in the organic EL display device in the invention, the sealing resin PL filled between the glass substrate SUB1 on which the organic EL elements OD are formed in a matrix (hereinafter referred to as an organic EL element substrate SUB1) and the sealing substrate SUB2 has thermoplasticity. The sealing resin PL in the present embodiment solidifies at room temperature, at which the organic EL display device typically operates, whereas softening at a temperature within a predetermined range above the temperature at which the organic EL display device typically operates. The temperature at which the sealing resin PL softens is desirably a temperature at which the organic EL elements OD provided on the organic EL element substrate SUB1 are not damaged and which falls within a predetermined range from 50 to 250 degrees inclusive. The sealing resin PL is sealed without leakage by attaching the sealing substrate SUB2 to the organic EL element substrate SUB1, on which the organic EL elements OD are formed, with a sealing material. While the sealing resin PL in the present embodiment contains an aluminum complex that functions as a desiccating agent, any material may be used as long as it has thermoplasticity at least in a defect elimination process.

The organic material that forms the organic light-emitting layer OEL is sensitive to water and degraded when absorbing water. Using the sealing resin PL having a desiccating agent capability allows the organic EL elements OD provided on the organic EL element substrate SUB1 to be protected from water.

A method for manufacturing the organic EL display device in the present embodiment will now be described.

First, stacking a colored conductive film made of aluminum or any other suitable material, a transparent conductive film made of ITO or any other suitable material, and an insulating layer, patterning the stacked films, and other processes are repeated to form the scan signal lines GL, the image signal lines DL, the power lines CSL, the thin-film transistors TFT1 and TFT2, the organic EL elements OD (each of which is formed of the anode electrode AD, the reflection electrode RAL, the organic light-emitting layer OEL, and the cathode electrode CD), and other components on the organic EL element substrate SUB1. The reflection electrode RAL and the anode electrode AD are provided by photolithography-based patterning for each of the pixel areas. After the anode electrode AD is stacked, the bank layer BNK is provided so that the pixel areas are separated in a grid pattern, and the organic light-emitting layer OEL is provided in a deposition process in which the hole transport layer, the light-emitting layer, and the electron transport layer are sequentially stacked in each of the areas separated by the bank layer BNK. The light-emitting layer in the organic light-emitting layer OEL is deposited by using a deposition mask three times to form RGB three color light emitting layers separately. The cathode electrode CD is formed via the bank layer BNK to cover all the organic light-emitting layers OEL in the pixel areas.

Figure 3:
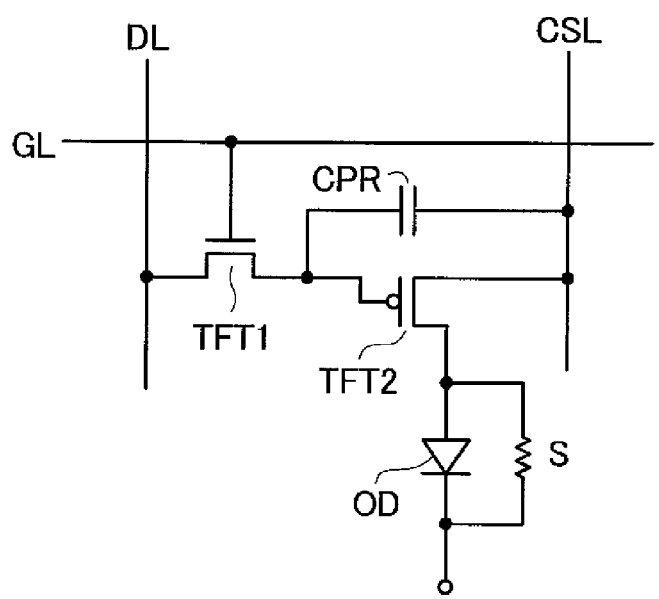
FIG. 3 is a circuit diagram showing a case where a contaminant has been introduced in a process of stacking an organic light-emitting layer and the contaminant short-circuits an organic EL element.

While the organic light-emitting layer OEL in the present embodiment is obtained by stacking three layers, the hole transport layer, the light-emitting layer, and the electron transport layer, any of these layers may be functionally combined into two layers or one layer, or other layers providing other functions, such as a hole injection layer and an electron injection layer, may be stacked in addition to the three layers. FIG. 3 is a circuit diagram representing a case where a contaminant has been introduced in the process of stacking the organic light-emitting layer OEL, and the contaminant forms a short circuit S between the anode electrode AD and the cathode electrode CD. As a result, holes and electrons that are supposed to be supplied to the light-emitting layer in the organic light-emitting layer OEL do not recombine in the light-emitting layer due to the short path S formed by the contaminant introduced into the organic light-emitting layer OEL, resulting in no light emission and a black-dot defect.

The sealing resin PL, which is shaped into a sheet, is bonded to the organic EL element substrate SUB1 on which the organic EL elements OD are provided in a matrix so that the upper side of the organic EL elements OD are covered. In this process, the entire structure is heated to a temperature at which the sealing resin PL softens, and the sealing resin PL is pressed against the cathode electrode CD having raised and recessed portions shown in FIG. 2 in such a way that no gap is present therebetween.

A sealing material is provided along the periphery of the sealing substrate SUB2, which is then bonded to the organic EL element substrate SUB1, to which the sealing resin PL has been attached in the pressing process. As a result, the sealing substrate SUB2 covers the sealing resin PL and the organic EL elements OD formed on the organic EL element substrate SUB1, whereby the sealing resin PL and the organic EL elements OD are sealed between the sealing substrate SUB2 and the organic EL element substrate SUB1. The sealing substrate SUB2 may be bonded to the organic EL element substrate SUB1 to which the sealing resin PL is attached in the pressing process as described above, or the sealing substrate SUB2 to which the sealing resin PL is bonded may be bonded to the organic EL element substrate SUB1 as will be described below. In this case, the sheet-like sealing resin PL is first bonded to the sealing substrate SUB2. A sealing material is then provided along the periphery of the sealing substrate SUB2, which is bonded to the organic EL element substrate SUB1. The entire structure is heated to a temperature at which the sealing resin PL softens, and the sealing resin PL is pressed against the cathode electrode CD having raised and recessed portions shown in FIG. 2 in such a way that no gap is present therebetween.

The organic EL elements OD formed on the organic EL element substrate SUB1 then undergo defect inspection. In the defect inspection, each of the organic EL elements OD is turned on and checked whether or not the organic EL element OD normally lights up, and any contaminant introduced into the organic light-emitting layer OEL is detected by visual inspection under a microscope or automatic detection based on a contaminant inspection apparatus.

When any contaminant that leads to a black-dot defect in the organic light-emitting layer OEL is found, the black-dot defect is eliminated in a laser repair process. FIGS. 4A to 4D show how a defect is eliminated in a repair process. First (FIG. 4A), a contaminant X introduced into the organic light-emitting layer OEL is irradiated with a laser beam traveling downward to the sealing substrate SUB2 (not shown in FIGS. 4A to 4D). The laser beam is emitted from a YAG laser or any other suitable laser. When the contaminant X is irradiated with the laser beam through the sealing substrate SUB2, the sealing resin PL, and the cathode electrode CD made of IZO, the defective portion that leads to a short circuit between the anode electrode AD and the cathode electrode CD is removed along with the contaminant X.

Figure 4A:
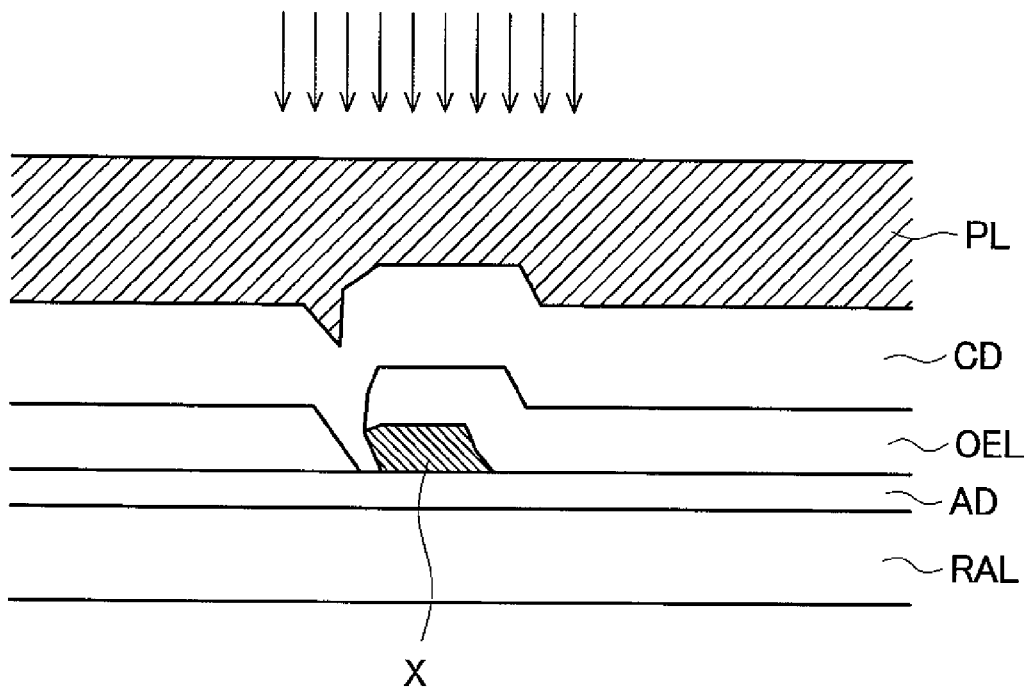
FIG. 4A shows how a defect is eliminated in a repair process.
Figure 4B:
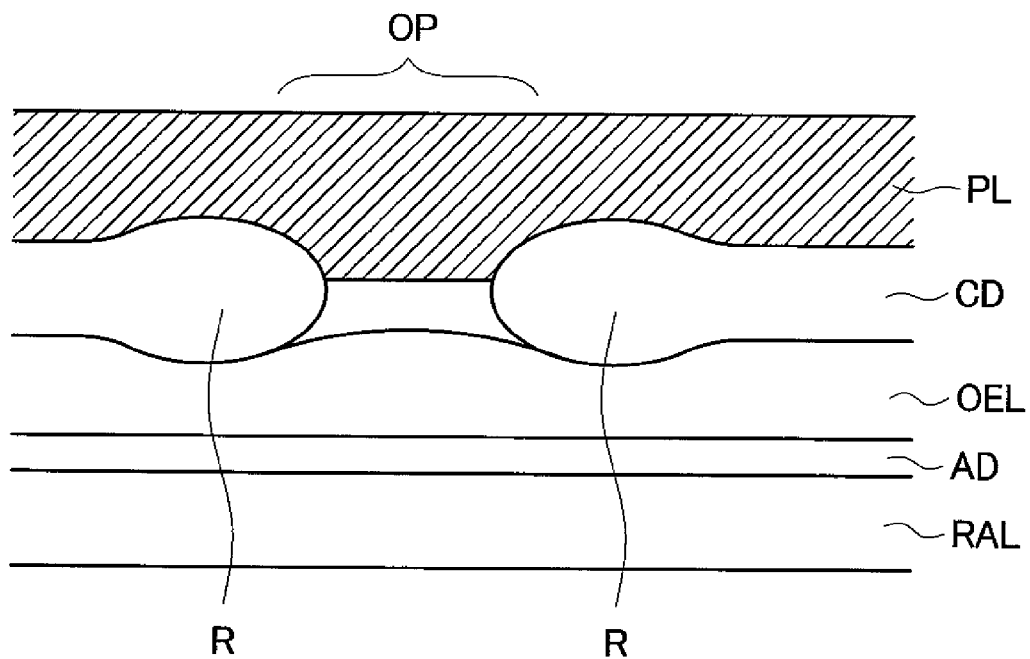
FIG. 4B shows how a defect is eliminated in a repair process.

FIG. 4B shows a state in which the contaminant X irradiated with the laser beam is removed. The energy provided from the laser beam evaporates the contaminant X, and the generated heat transferred from the contaminant X destroys part of the cathode electrode CD, whereby an opening OP is formed and the IZO aggregates along an edge R of the opening OP. The heat is further transferred from the cathode electrode CD, in which the opening OP has been formed, to the sealing resin PL, and the portion of the thermoplastic sealing resin PL that is in the vicinity of the opening OP temporarily softens. As a result, the edge R of the opening OP formed in the cathode electrode CD is shaped into a ring one side of which is raised toward the organic EL element substrate SUB1 and the opposite side of which is raised toward the softened sealing resin PL, and the edge R becomes thicker than the other portions of the cathode electrode CD, as shown in FIG. 4B. After the repair process, the edge R has a shape that unlikely causes electric field concentration between the anode electrode AD and the cathode electrode CD, and the shape reduces the possibility of producing a black-dot defect again and hence improves the reliability after the repair process.

Figure 5:
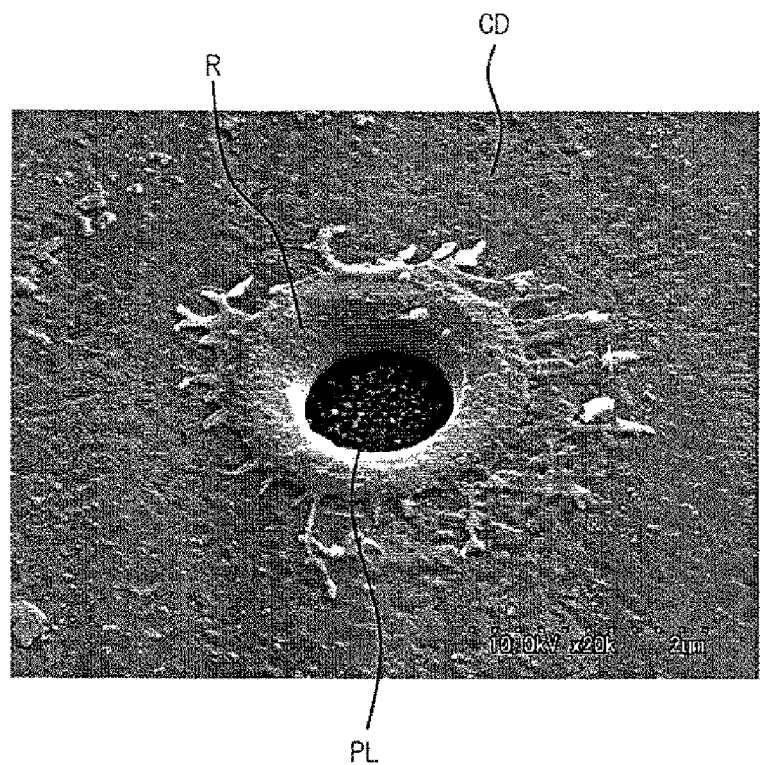
FIG. 5 is a photograph taken with an electron microscope and showing that a contaminant is irradiated with a laser beam and an opening is formed in a cathode electrode.
Figure 6:
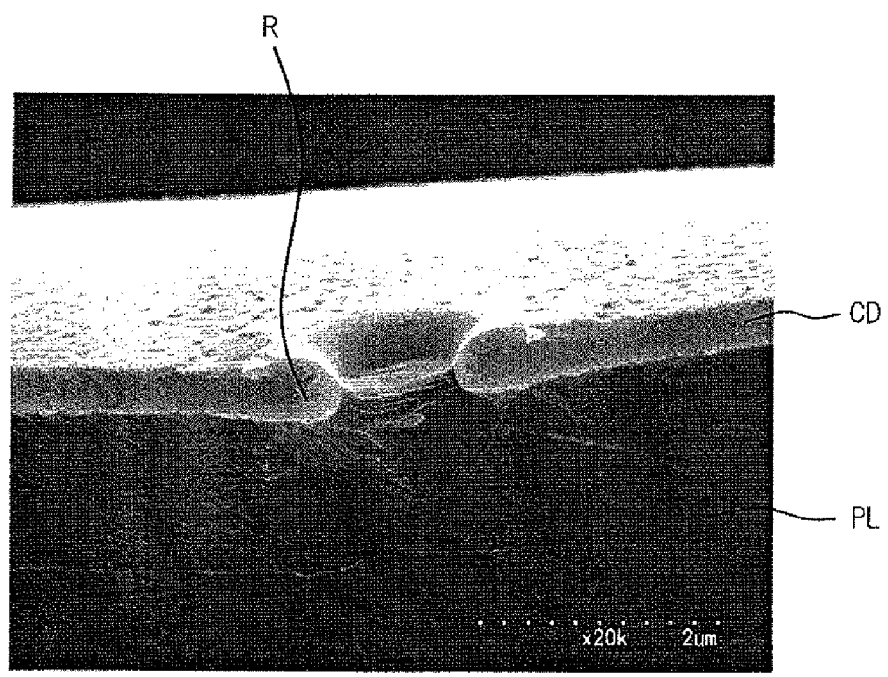
FIG. 6 is a photograph taken with an electron microscope and showing a cross section of the opening formed in the cathode electrode by irradiating the contaminant with the laser beam.
Figure 7:
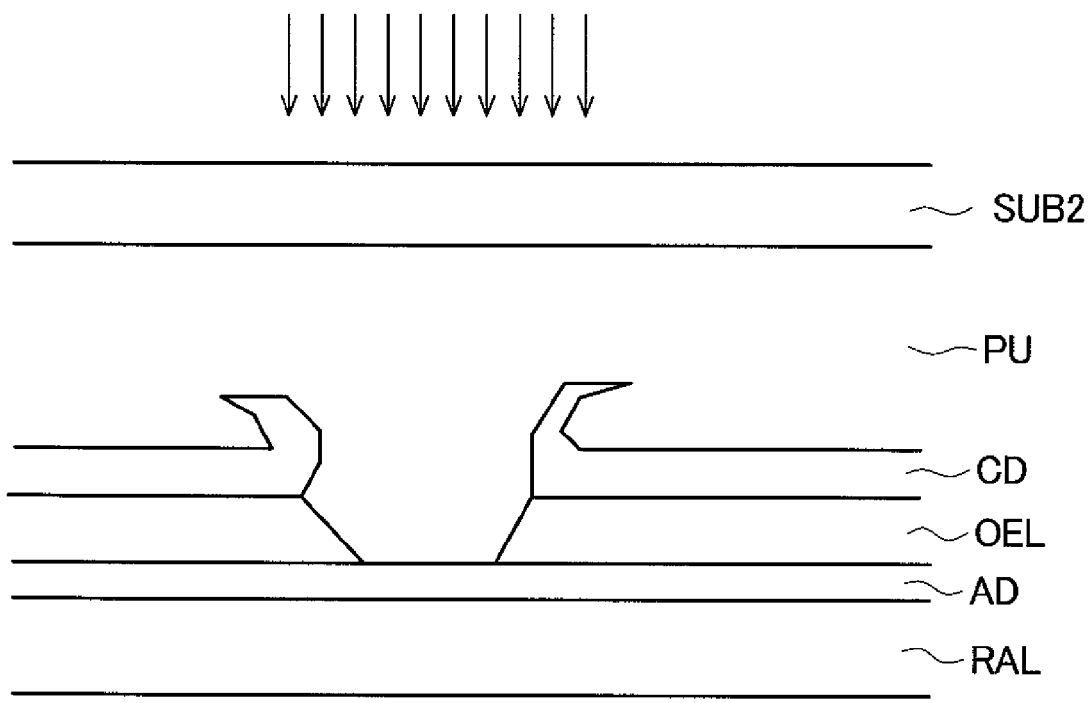
FIG. 7 shows a black-dot defect eliminated from an organic EL display device of related art using hollow sealing technique.

FIG. 5 is a photograph taken with an electron microscope and showing that the contaminant X is irradiated with a laser beam to be eliminated and the opening OP is formed in the cathode electrode CD. The photograph shows the state shown FIG. 4B but taken from below. It is noted that before the photograph was taken, the organic light-emitting layer OEL, the anode electrode AD, the reflection electrode RAL, the insulating layers IS2 and IS1, the protective layer PA2, and other components were removed. In the photograph of FIG. 5, the sealing resin PL is exposed through the opening OP, and the edge R of the opening OP has the shape of a ring. FIG. 6 is a photograph of the state shown in FIG. 4B, taken with an electron microscope and showing a cross section of the opening formed in the cathode electrode CD. As shown in the photograph of FIG. 6, the edge R of the opening OP is shaped into a ring one side of which is raised toward the organic EL element substrate SUB1 and the opposite side of which is raised toward the sealing resin PL.

The film thickness of the organic light-emitting layer OEL varies in accordance with the color of the light emitted from the organic light-emitting layer OEL. The film thickness of the organic light-emitting layer OEL is desirably large in order to avoid conduction between the anode electrode AD and the cathode electrode CD, for example, when the structure is pressed after a defect is removed. Since the edge R of the opening OP in the present embodiment is also raised upward and less raised downward accordingly, the anode electrode AD unlikely comes into contact with the cathode electrode CD.

Figure 4C:
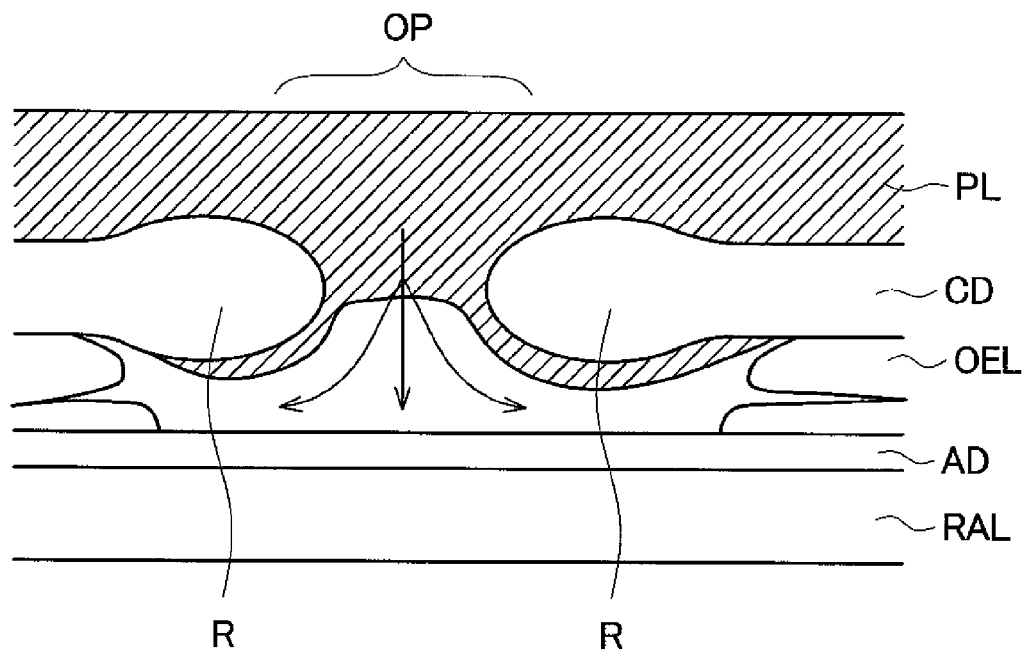
FIG. 4C shows how a defect is eliminated in a repair process.

FIG. 4C shows a state in which after the state shown in FIG. 4B, the sealing resin PL that has been temporarily softened by the laser irradiation flows into the portion where the contaminant X has been evaporated and eliminated. As shown in FIG. 4C, the removal of the contaminant X is accompanied by the removal of the organic light-emitting layer OEL in the vicinity of the contaminant X, and the softened sealing resin PL flows along the surface of the edge R into the removed portion and covers the edge R. As a result, even when the structure is pressed from the side where the sealing substrate SUB2 is present after the repair, the fact that the surface of the edge R that is on the side where the organic light-emitting layer OEL is present is covered with the sealing resin PL reduces the possibility of direct contact with the anode electrode AD, whereby the reliability after the repair is improved.

Figure 4D:
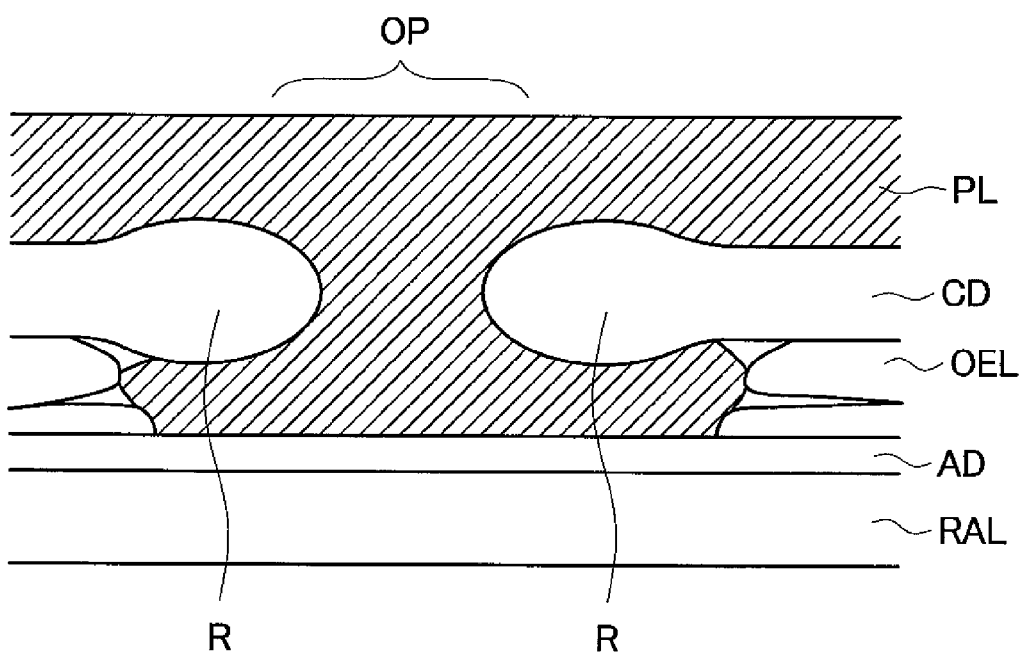
FIG. 4D shows how a defect is eliminated in a repair process.

FIG. 4D shows a state in which after the state shown in FIG. 4C, the entire organic EL element substrate SUB1 on which the organic EL elements OD are formed is heated so that the portion from which the contaminant X is evaporated is filled with the sealing resin PL. As shown in FIG. 4D, the removal of the contaminant X in the laser beam irradiation process is accompanied by the removal of the organic light-emitting layer OEL in the vicinity of the opening OP, and the region from which the organic light-emitting layer OEL has been removed is filled with the sealing resin PL. As a result, the sealing resin PL is interposed between the cathode electrode CD and the anode electrode AD, whereby the reliability after the repair is further improved.

In the present embodiment, since three types of organic light-emitting layers OEL are formed to emit three different color light beams, the sealing substrate SUB2 requires no color filters. In this configuration, a defect, if any, is detected after the sealing substrate SUB2 is attached to the organic EL element substrate SUB1, and the defect is eliminated by irradiating it with a laser beam traveling downward to the sealing substrate SUB2. Alternatively, a defect, if any, may be detected before the sealing substrate SUB2 is attached, and the defect may be eliminated by irradiating it with a laser beam traveling downward to the sealing resin PL. When color filters are provided in the sealing substrate SUB2, a defect, if any, is eliminated before the sealing substrate SUB2 is attached because the laser beam does not pass through the color filters.

In the present embodiment, the reliability after the repair is improved by heating the organic EL element substrate SUB1 to change the state shown in FIG. 4C to that shown in FIG. 4D. The heating process may be formed of separate steps, the laser irradiation step and the heating step, as in the present embodiment. For example, the heating step may be combined with a test for the operation of the organic EL display device heated to a high temperature immediately before shipment (heat run). Further, a heating process may be carried out to change the state shown in FIG. 4B to that shown in FIG. 4C. Alternatively, without carrying out any heating process, the temperature at which the sealing resin PL softens or the energy used to generate the laser beam may be adjusted in such a way that the irradiation of the contaminant X with the laser beam softens the sealing resin PL in the vicinity of the opening OP and the sealing resin PL is interposed between the anode electrode AD and the cathode electrode CD.

While the present embodiment has been described with reference to the case where the invention is applied to a top-emission organic EL display device, the invention is applicable to a bottom-emission organic EL display device in the same manner. In this case as well, the reliability of the organic EL display device that has undergone defect repair can be improved. In the latter case, since the electrode formed above the organic light-emitting layer OEL is the reflection electrode, the laser beam is applied from the side where the organic EL element substrate SUB1 is present.

In the present embodiment, while the energy used to generate a laser beam is adjusted so that the contaminant X is evaporated, the energy to generate a laser beam may be increased, for example, to the extent that the anode electrode AD and the reflection electrode RAL are almost damaged so that the contaminant X is reliably evaporated and the defect is eliminated.

In the present embodiment, while the cathode electrode CD that functions as a cathode is disposed above the organic light-emitting layer OEL and the anode electrode AD that functions as an anode is disposed below the organic light-emitting layer OEL, the arrangement of the electrode that functions as the anode and the electrode that functions as the cathode may be reversed.

The organic EL display device according to the embodiment of the invention described above is not limited thereto, but may be implemented in a different form within the technical spirit of the invention.

What is claimed is:

1. A method for manufacturing an organic EL display device, the method comprising:
    an organic EL element substrate formation step of forming at least one organic EL element on an organic EL element substrate, the organic EL element including an organic EL film, a first conductive film provided below the organic EL film, and a second conductive film provided above the organic EL film;
    a resin sealing step of providing a thermoplastic sealing resin to cover the upper side of the organic EL element;
    a defect detection step of detecting a defect in the organic EL element; and
    a defect elimination step of eliminating the defect detected in the defect detection step by irradiating the defect with a laser beam;
    wherein in the defect elimination step, an opening is formed in the second conductive film when the defect is irradiated with the laser beam, the edge of the opening being raised toward not only the side where the sealing resin is present but also the side where the organic EL film is present and hence thicker than the second conductive film.

2. The method for manufacturing an organic EL display device according to claim 1,
    wherein in the defect elimination step, at least part of the edge on the side where the organic EL film is present is covered with the sealing resin.

3. The method for manufacturing an organic EL display device according to claim 2,
    wherein in the defect elimination step, the organic EL film in the vicinity of the opening is removed when the defect is irradiated with the laser beam, and the sealing resin is heated and softened to fill the area from which the organic EL film is removed, whereby the sealing resin is interposed between the first conductive film and the second conductive film.

4. A method for manufacturing an organic EL display device, the method comprising:
    an organic EL element substrate formation step of forming at least one organic EL element on an organic EL element substrate, the organic EL element including an organic EL film, a first conductive film provided below the organic EL film, and a second conductive film provided above the organic EL film;
    a resin sealing step of providing a thermoplastic sealing resin to cover the upper side of the organic EL element;
    a defect detection step of detecting a defect in the organic EL element; and
    a defect elimination step of eliminating the defect detected in the defect detection step by irradiating the defect with a laser beam;
    wherein the sealing resin has thermoplasticity in which the sealing resin solidifies at room temperature, whereas softening at a temperature within a predetermined range outside room temperature.

5. The method for manufacturing an organic EL display device according to claim 4,
    wherein the sealing resin softens at a temperature within a range from 50 to 250 degrees inclusive.

6. A method for manufacturing an organic EL display device, the method comprising:
    an organic EL element substrate formation step of forming at least one organic EL element on an organic EL element substrate, the organic EL element including an organic EL film, a first conductive film provided below the organic EL film, and a second conductive film provided above the organic EL film;
    a resin sealing step of providing a thermoplastic sealing resin to cover the upper side of the organic EL element;
    a defect detection step of detecting a defect in the organic EL element; and
    a defect elimination step of eliminating the defect detected in the defect detection step by irradiating the defect with a laser beam;
    wherein the sealing resin has a desiccating agent capability.

7. A method for manufacturing an organic EL display device, the method comprising:
    an organic EL element substrate formation step of forming at least one organic EL element on an organic EL element substrate, the organic EL element including an organic EL film, a first conductive film provided below the organic EL film, and a second conductive film provided above the organic EL film;
    a resin sealing step of providing a thermoplastic sealing resin to cover the upper side of the organic EL element;
    a defect detection step of detecting a defect in the organic EL element; and a defect elimination step of eliminating the defect detected in the defect detection step by irradiating the defect with a laser beam;

further comprising a sealing substrate attachment step of attaching a sealing substrate that covers the upper side of the organic EL element and the sealing resin to the organic EL element substrate;

wherein in the organic EL element substrate formation step, a plurality of organic EL elements that emit light in different colors are formed on the organic EL element substrate) and in the defect elimination step, the laser beam is applied downward to the sealing substrate.

8. A method for manufacturing an organic EL display device, the method comprising:

an organic EL element substrate formation step of forming at least one organic EL element on an organic EL element substrate, the organic EL element including an organic EL film, a first conductive film provided below the organic EL film, and a second conductive film provided above the organic EL film;

a resin sealing step of providing a thermoplastic sealing resin to cover the upper side of the organic EL element;

a defect detection step of detecting a defect in the organic EL element; and a defect elimination step of eliminating the defect detected in the defect detection step by irradiating the defect with a laser beam;

further comprising a sealing substrate attachment step of providing a thermoplastic sealing resin on a sealing substrate and attaching the sealing substrate to the organic EL element substrate;

wherein in the organic EL element substrate formation step, a plurality of organic EL elements that emit light in different colors are formed on the organic EL element substrate; and in the defect elimination step, the laser beam is applied downward to the sealing substrate.

9. A method for manufacturing an organic EL display device, the method comprising:

an organic EL element substrate formation step of forming at least one organic EL element on an organic EL element substrate, the organic EL element including an organic EL film, a first conductive film provided below the organic EL film, and a second conductive film provided above the organic EL film;

a resin sealing step of providing a thermoplastic sealing resin to cover the upper side of the organic EL element;

a defect detection step of detecting a defect in the organic EL element; and a defect elimination step of eliminating the defect detected in the defect detection step by irradiating the defect with a laser beam;

wherein the first conductive film is a conductive film that reflects the light emitted from the organic EL film; and the second conductive film is a transparent conductive film that transmits the light emitted from the organic EL film.

* * * * *